US009978433B2

United States Patent
Andre

(10) Patent No.: US 9,978,433 B2
(45) Date of Patent: *May 22, 2018

(54) NON-DESTRUCTIVE WRITE/READ LEVELING

(71) Applicant: Everspin Technologies, Inc., Chandler, AZ (US)

(72) Inventor: Thomas Andre, Austin, TX (US)

(73) Assignee: EVERSPIN TECHNOLOGIES, INC., Chandler, AZ (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/368,871

(22) Filed: Dec. 5, 2016

(65) Prior Publication Data

US 2017/0084323 A1    Mar. 23, 2017

Related U.S. Application Data

(60) Division of application No. 15/041,247, filed on Feb. 11, 2016, now Pat. No. 9,548,098, which is a (Continued)

(51) Int. Cl.
*G11C 7/00* (2006.01)
*G11C 11/16* (2006.01)
(Continued)

(52) U.S. Cl.
CPC ...... *G11C 11/1675* (2013.01); *G06F 12/0238* (2013.01); *G11C 7/20* (2013.01); *G11C 11/1673* (2013.01); *G11C 11/1693* (2013.01); *G11C 14/00* (2013.01); *G11C 29/023* (2013.01); *G11C 29/028* (2013.01); *G11C 2029/0407* (2013.01)

(58) Field of Classification Search
CPC ... G11C 11/1675; G11C 7/20; G11C 11/1673; G11C 11/1693; G11C 29/023; G11C 29/028
USPC ............ 365/189.17, 189.12, 189.14, 189.16, 365/189.18
See application file for complete search history.

(56) References Cited

U.S. PATENT DOCUMENTS

| 5,687,183 A | 11/1997 | Chesley |
| 6,418,506 B1 | 7/2002 | Pashley et al. |
(Continued)

FOREIGN PATENT DOCUMENTS

JP    2004/265483 A    9/2004

OTHER PUBLICATIONS

Supplementary European Search Report dated Mar. 23, 2017, in corresponding EP Application No. EP 14 83 7367, 7 pages.
(Continued)

*Primary Examiner* — Son Dinh
(74) *Attorney, Agent, or Firm* — Bookoff McAndrews, PLLC

(57) ABSTRACT

In some examples, a memory device is configured with non-volatile memory array(s) having one or more associated volatile memory arrays. The memory device may include a non-destructive write mode configured to prevent access to the non-volatile memory array(s) during an initiation or calibration sequence performed by the memory device or an electronic device associated with the memory device to calibrate read and write access timing associated with the memory device.

20 Claims, 5 Drawing Sheets

Related U.S. Application Data continuation of application No. 14/463,369, filed on Aug. 19, 2014, now Pat. No. 9,275,715.

(60) Provisional application No. 61/868,221, filed on Aug. 21, 2013.

(51) Int. Cl.
*G11C 7/20* (2006.01)
*G11C 29/02* (2006.01)
*G11C 14/00* (2006.01)
*G06F 12/02* (2006.01)
*G11C 29/04* (2006.01)

(56) References Cited

U.S. PATENT DOCUMENTS

| | | | |
|---|---|---|---|
| 7,068,562 B2 | 6/2006 | Miura et al. | |
| 7,126,851 B2 | 10/2006 | Hosono et al. | |
| 7,430,136 B2 * | 9/2008 | Merry, Jr. | G06F 12/1433 365/185.04 |
| 8,122,204 B2 | 2/2012 | Nagao et al. | |
| 9,275,715 B2 | 3/2016 | Andre et al. | |
| 9,548,098 B2 * | 1/2017 | Andre | G11C 11/1673 |
| 2003/0046596 A1 * | 3/2003 | Floyd | H04L 1/24 713/400 |
| 2008/0098190 A1 | 4/2008 | Takase | |
| 2009/0067277 A1 | 3/2009 | Smith et al. | |
| 2010/0306448 A1 | 12/2010 | Chen et al. | |
| 2012/0195112 A1 | 8/2012 | Alam et al. | |
| 2012/0297147 A1 | 11/2012 | Mylly et al. | |

OTHER PUBLICATIONS

International Search Report and Written Opinion dated Jan. 14, 2015, in corresponding PCT application No. PCT/US2014/051691, filed Aug. 19, 2014, 10 pages.

* cited by examiner

NON-DESTRUCTIVE WRITE/READ LEVELING

RELATED APPLICATION

This application is a divisional of U.S. application Ser. No. 15/041,247, filed on Feb. 11, 2016. Application Ser. No. 15/041,247 is a continuation of U.S. application Ser. No. 14/463,369, filed on Aug. 19, 2014, which issued as U.S. Pat. No. 9,275,715 on Mar. 1, 2016. This application and application Ser. Nos. 15/041,247 and 14/263,369 claim priority to U.S. Provisional Application No. 61/868,221 to Andre, entitled "Non-Destructive Write/Read Leveling Using User Accessible Register," filed Aug. 21, 2013. The contents of application Ser. Nos. 15/041,247, 14/463,369, and 61/868,221 are incorporated herein by reference in their entirety.

BACKGROUND

When a memory device is activated, the memory device may perform a calibration or an initialization sequence. The calibration or initialization sequence may require reading and writing test data to and from multiple memory arrays. Unfortunately, in some types of memory devices, the writing or reading of test data to the memory arrays during the calibration or initialization sequence may result in unintentional overwriting of data stored in the memory arrays.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

DETAILED DESCRIPTION

Figure 1:
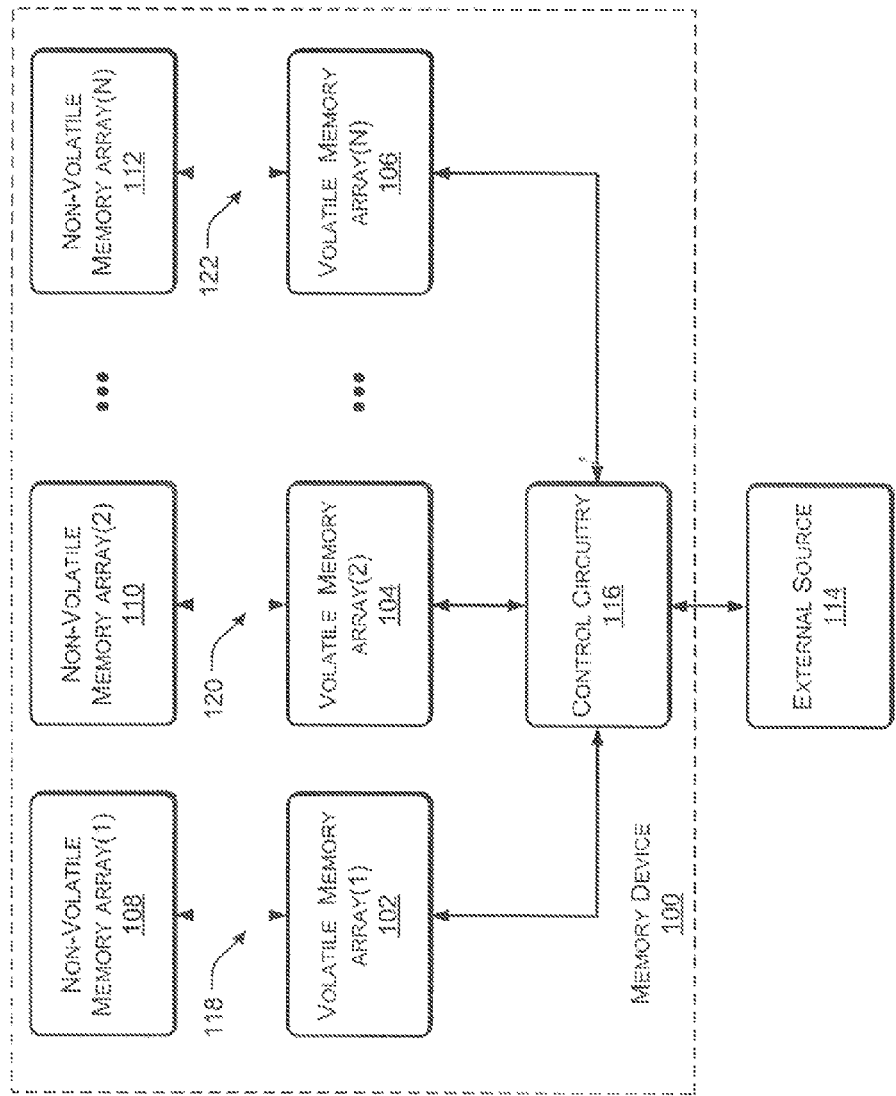
FIG. 1 illustrates an example block diagram of select components of a memory device including non-volatile memory arrays and volatile memory arrays for preventing reads/writes to the non-volatile memory arrays during calibration or initialization of the memory device.

This disclosure includes, in part, techniques and implementations to improve the reliability of memory devices. For example, this disclosure includes improved systems and methods for initializing or calibrating memory devices including non-volatile or "permanent" storage capable of maintaining data when a power supply is deactivated (e.g., magnetic memories or magnetic random access memories or MRAMs).

In general, memory devices, such as random access memories (RAMs) perform a calibration or initialization sequence to adjust the timing requirements associated with reading data from the memory device and writing data to the memory device. The initialization process may involve calibrating a write time and a read time by, for example, writing and reading predetermined data sets into the memory arrays. Unfortunately, in some cases, memory devices that include non-volatile memory arrays may be utilized by an electronic device to store executable code and persistent data, in addition to or in lieu of the electronic device's disk drives, as memory devices that include non-volatile memory arrays are also capable of maintaining data when the power supply is deactivated.

When the non-volatile memory arrays store executable code or data intended to persist through the deactivation of the memory device, the executable code or persistent data may be partially or completely overwritten by the calibration data during the initialization sequence, potentially resulting in errors, loss of data, and/or data corruption. Therefore, in some implementations described herein, an individual non-volatile memory array is paired with a volatile memory array, such that data may be read from and written to the volatile memory array during the calibration or initialization process without overwriting the data stored in the non-volatile memory arrays. In some cases, the memory devices may be configured to include control circuitry that may route activate and precharge commands to the non-volatile memory arrays and may route read and write commands to the volatile memory arrays. In this manner, data may be transferred to and from the non-volatile memory array to the volatile memory array and to and from the volatile memory array to a cache or other external location and the calibration or initialization sequence of the memory device may be performed via read and write commands issued to the volatile memory arrays without affecting the data stored in the non-volatile memory arrays.

In other implementations, the memory device may be configured to include one or more registers to activate and deactivate a non-destructive write mode and/or a non-destructive read mode to prevent overwriting of data stored in the non-volatile memory arrays. For example, the memory device may include one or more user accessible or programmable registers that may allow a user or external source to configure the non-destructive write mode and/or the non-destructive read mode of operation for the memory device. In some cases, in addition to preventing read/write access during the initialization or calibration process, the user may utilize the register to place the memory device into the non-destructive write mode and/or a non-destructive read mode during standard operations of the memory device (for example, to test the memory device).

In other examples, the memory device may be configured to default to the non-destructive write mode (for instance, via a initialization register), in response to a power up of the memory device and to exit the non-destructive write mode following a signal from control circuitry indicating that the calibration or initialization sequence is complete. In some examples, the register may include one or more initialization or mode registers, one or more user or externally accessible registers, one or more flip flops, latches, or other storage elements.

In some implementations, the status of the non-destructive write mode and/or a non-destructive read mode may be controlled by a state machine that implements the operations of disabling reading and/or writing data to/from the non-volatile memory arrays. For example, the state machine may set one or more values based on the status of the initialization or calibration sequence, the state of the power supply, and/or the state of the memory device.

In some particular implementations, the one or more registers controlling access to the non-volatile memory arrays may be placed within a data path and/or configured to operate with circuitry associated with normal operations of the memory device, such as data paths, command line paths, and/or addressing circuitry. For example, the registers may be located on the command line path between the control circuitry and each of the non-volatile memory arrays.

FIG. 1 illustrates an example block diagram of select components of a memory device 100 including and non-volatile memory arrays 108, 110, and 112 and volatile memory arrays 102, 104 and 106 for preventing read/writes to the non-volatile memory arrays 108, 110, and 112 during calibration or initialization of the memory device 100. In some examples, the memory device 100 may include removable and/or non-removable media implemented in various types of technology for storage of information such as computer-readable instructions or modules, data structures, program modules or other data. Such computer-readable media may include, but is not limited to, RAM, ROM, EEPROM, flash memory or other computer-readable media technology, solid state storage, RAID storage systems, storage arrays, network attached storage, storage area networks, cloud storage, or any other medium that may be used to store information. In some particular implementations, the non-volatile memory array may include elements of magnetic memories or magnetic random access memories (MRAMs), such as magnetic memory cells or magnetic disk storage.

In general, the memory device 100 may be an example of tangible non-transitory computer storage media including both temporary or volatile memory arrays 102, 104, and 106 and permanent or non-volatile memory arrays 108, 110, and 112. In the illustrated example, each of the non-volatile memory arrays 108, 110, and 112 are associated with a corresponding one of the volatile memory arrays 102, 104 and 106, such that when data that is stored in the non-volatile memory arrays 108, 110, and 112 is being accessed by an external source 114 (e.g., one or more circuits associated with the electronic device accessing the memory device 100) the data may first be stored in the corresponding or associated volatile memory arrays 102, 104, and 106 to protect the data stored in the non-volatile memory arrays 108, 110, and 112 from inadvertent or unnecessary modifications and/or deletions. For example, the non-volatile memory array 108 (identified as "Non-Volatile Memory Array(1)") is associated with the volatile memory array 102 (identified as "Volatile Memory Array(1)").

In the illustrated example, three non-volatile arrays 108, 110, and 112 and three associated volatile memory arrays 108, 110, and 112 are shown. However, it should be understood that the memory device 100 may be arranged with an alternative number of non-volatile memory arrays and an alternative number of volatile memory arrays. Additionally, in some implementations, there may not be a one to one correspondence between the non-volatile memory arrays and the volatile memory arrays. For instance, a single volatile memory array may be associated with two or more non-volatile memory arrays, such that when data is read from the corresponding non-volatile memory arrays the data is copied or transferred to the volatile memory array before the external source 114 is permitted to access or edit the data. For example, volatile memory array(1) 102 may be associated with both non-volatile memory array(1) 108 and non-volatile memory array(2) 110.

In some examples, the control circuitry 116 is configured to receive various commands from the external source 114. For example, the external source 114 may issue activate commands to cause data stored in the non-volatile memory arrays 108, 110, and 112 of the memory device 100 to be loaded into the associated volatile memory arrays 102, 104, and 106 and/or into one or more caches (not shown) accessible to the external source 114. In other examples, the external source 114 may issue precharge commands to cause the data stored in the volatile memory arrays 102, 104, and 106 or in the cache accessible to the external source 114 to be written back into the non-volatile memory arrays 108, 110, and 112 in order to prepare the cache for receiving another block of data. In some examples, the control circuitry 116 may receive a read command and/or a write command from the external source 114 to access and/or modify the data stored in the volatile memory arrays 102, 104, and 106 or in the cache accessible to the external source 114.

In some implementations, a mode register associated with the control circuitry 116 may be configured to activate and deactivate a non-destructive write mode and/or a non-destructive read mode. In some examples, when the non-destructive modes are active, data access (e.g., loads and writes backs) between the non-volatile memory arrays 108, 110, and 112 and the volatile memory arrays 102, 104, and 106 are prevented, as indicated by dashed lines 118, 120, and 122. In this manner, the calibration or initialization sequence may be performed by the control circuitry 116 and/or the external source 114 by reading and writing data into the volatile memory arrays 102, 104, and 106 without overwriting or introducing other errors into the non-volatile arrays 108, 110, and 112.

In other implementations, the non-destructive write mode and/or the non-destructive read mode may be configured to prevent operations associated with select control signals or commands, such as the precharge and activate commands, from being performed in conjunction with the non-volatile memory arrays 108, 110, and 112 and/or the volatile memory arrays 102, 104, and 106. For instance, in some implementations, a precharge command may cause data stored in the volatile memory arrays 102, 104, and 106 to be transferred or written to the non-volatile memory arrays 108, 110, and 112. The read and write commands may allow the external source 114 to access and/or edit the data stored in the volatile memory arrays 102, 104, and 106. Thus, in some examples, the mode register associated with the control circuitry 116 may be configured to activate and deactivate the non-destructive write mode and/or the non-destructive read mode to prevent operations associated with select control signals and/or commands from being carried out or performed by the memory arrays 102-112.

In one particular example, when the non-destructive write mode and/or the non-destructive read mode is active, the memory device 100, the memory arrays 102-112, and/or the control circuitry 116 may be configured to ignore operations associated with the precharge and activate commands, while performing operations associated with the read and write commands. In this manner, the calibration or initialization sequence may read and write data into the volatile memory arrays 102, 104, and 106 without overwriting or introducing other errors into the non-volatile memory arrays 108, 110, and 112. In some particular implementations, the non-destructive write mode may be utilized without a non-destructive read mode, such that the memory device 100 may be configured to allow the data to be loaded from the non-volatile memory arrays 108, 110, and 112 but prevent data from being written back to the non-volatile memory arrays 108, 110, and 112.

In some examples, the mode register configured to activate and deactivate the non-destructive write mode and/or the non-destructive read mode may be one or more externally accessible or user programmable registers that may allow a user or the external source 114 to set an operating mode for the memory device 100. In some cases, in addition to preventing load/write back access to the non-volatile memory arrays 108, 110, and 112 during the initialization or calibration process, the mode register may prevent access to the non-volatile memory arrays 108, 110, and 112 during standard operations of the memory device 100, for instance, during a test or maintenance mode. In other examples, the mode register may be an initialization register configured to default to the non-destructive write mode and/or a non-destructive read mode in response to a power up of the memory device 100 and to exit the non-destructive write mode and/or the non-destructive read mode following a signal from the control circuitry 116 indicating that the calibration or initialization sequence is complete. In some examples, the mode register may include one or more flip flops, latches, or other storage elements.

In some implementations, the condition of the non-destructive write mode and/or the non-destructive read mode may be controlled by a state machine associated with the control circuitry 116 that implements the operations of disabling reading data from the non-volatile memory arrays 108, 110, and 112 and/or writing data to the non-volatile memory arrays 108, 110, and 112. For example, the state machine may set one or more values based on the status of the initialization or calibration sequence, the state of a power supply (not shown), and/or the state of the memory device 100.

In some particular implementations, the mode register may be placed within a data path and/or configured to operate with circuitry associated with normal operations of the memory device, such as data paths, command line paths, and/or addressing circuitry. For example, the register(s) may be located on the command line path between the control circuitry 116 and each of the non-volatile memory arrays 108, 110, and 112, as illustrated below with respect to FIG. 2.

Figure 2:
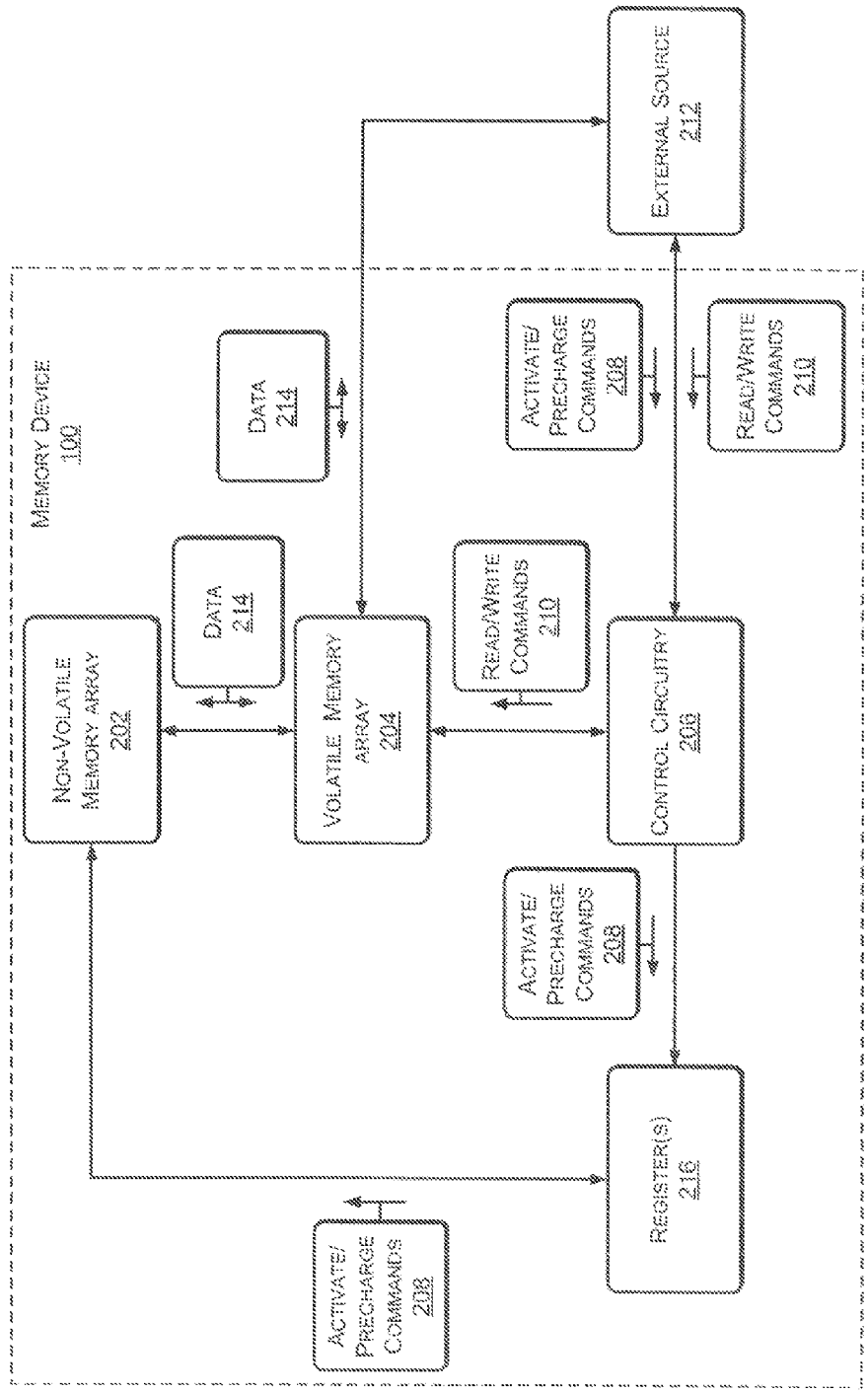
FIG. 2 illustrates another example block diagram of select components of a memory device for preventing reads/writes to the non-volatile memory arrays during calibration or initialization of the memory device.

FIG. 2 illustrates another example block diagram of select components of a memory device 200 for preventing reads and/or writes to a non-volatile memory array 202 during calibration or initialization of the memory device 200. In the illustrated example, circuitry, data paths, and control paths are shown with respect to the non-volatile memory array 202 and a corresponding volatile memory array 204. However, it should be understood that the memory device 200 may include any number of non-volatile memory arrays and volatile memory arrays, as described above with respect to FIG. 1.

In the illustrated example, the memory device 200 includes control circuitry 206 configured to receive activate/precharge commands 208 and read/write commands 210 from an external source 212 accessing data stored in the non-volatile memory array 202. In some cases, the control circuitry 206 may include row selection circuitry, column selection circuitry, sense amplifiers, write drivers, and/or charge pumps, among other circuits for operating a memory device.

In general, the read/write commands 210 are received by the control circuitry 206 and routed to the volatile memory array 204, such that the external source 212 is able to access data 214 stored within the volatile memory array 204. Similarly, the activate/precharge commands 208 are received by the control circuitry 206 and routed to the non-volatile memory array 202 via one or more registers 216.

In general, the data 214 may be transferred between the non-volatile memory array 202 and the volatile memory array 204. The external source 212 may be configured to access the data 214 once the data 214 has been transferred from the non-volatile memory array 202 and stored within the volatile memory array 204. Thus, in some examples, the non-volatile memory array 204 may act as a cache for storing the data 214 while the data is being accessed by the external source 212. In other examples, the external source 212 may be configured to access the data 214 when the data 214 is stored in a cache (not shown), and the volatile memory array 204 may store the data 214 while the data 214 is being written back to or loaded from the non-volatile memory array 202 to prevent errors which may be introduced, for instance, if a power failure occurs during a write operation associated with the non-volatile memory array 202.

The register(s) 216 may be configured to activate and deactivate a non-destructive write mode. In some examples, when the non-destructive write mode is active, the register(s) 216 may prevent the activate/precharge commands from reaching the non-volatile memory array 202, which in turn may prevent the data 214 stored within the non-volatile memory array 202 from being accessed by the external source 212.

In some examples, the register(s) 216 may be one or more user accessible or programmable registers to allow a user or the external source 212 to set a write mode of operating for the memory device 200. In other examples, the register(s) 216 may be an initialization register configured to default to the non-destructive write mode, in response to a power up of the memory device 200 and to exit the non-destructive write mode following a signal from the control circuitry 206 or the external source 212 indicating that the calibration or initialization sequence is complete. In some examples, the register(s) 216 may include one or more flip flops, latches, or other storage elements that may be configured to decouple the control circuitry 206 from the non-volatile memory array 202.

In the illustrated example, the register(s) 216 may prevent both the activate and precharge commands 208 from reaching the non-volatile memory array 202, thereby preventing the associated activate and precharge operations from being performed on the non-volatile memory array 202. However, in other examples, the register(s) 216 may be configured to prevent the operations associated with the precharge commands from being carried out at the non-volatile memory array 202, while allowing the operations associated with the activate commands to be carried out at the non-volatile memory array 202 (e.g., data may be transferred from the non-volatile memory array 202 to the volatile array 204 but data may be prevented from being transferred from the volatile array 204 to the non-volatile memory array 202). In this manner, the register(s) 216 may set the non-destructive write mode to prevent the data 214 from being written back to the non-volatile memory array 202, while allowing the data 214 to be loaded from non-volatile memory array 202.

While FIG. 2 depicts one or more registers 216 configured to implement a non-destructive write mode during the initialization or calibration process of the memory device 200, it should be understood that one or more registers 216 may be placed within a command path to implement the non-destructive write mode of a memory device including multiple non-volatile memory arrays, as illustrated below with respect to FIG. 3.

Figure 3:
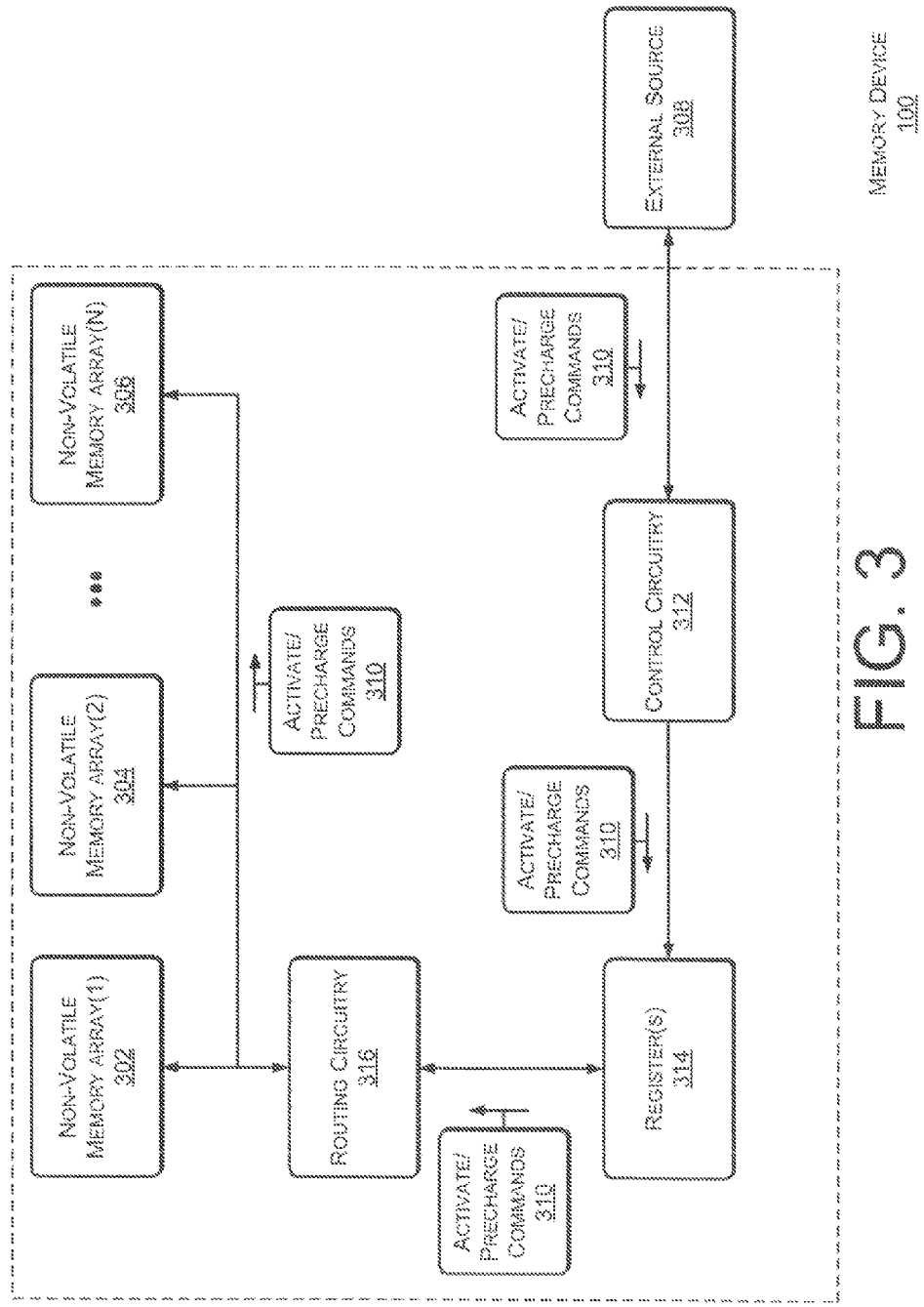
FIG. 3 illustrates yet another example block diagram of select components of a memory device for preventing reads/writes to the non-volatile memory arrays during calibration or initialization of the memory device.

FIG. 3 illustrates yet another example block diagram of select components of a memory device 300 for preventing read/writes to the non-volatile memory arrays 302, 304, and 306 during calibration or initialization of the memory device 300. As described above with respect to FIG. 2, an external source 308 may issue activate and/or precharge commands 310 that are received by control circuitry 312 of the memory device 300. The control circuitry 312 may then route the activate/precharge commands 310 or may issue access commands to one or more of the non-volatile memory arrays 302, 304, and 306.

In the illustrated example, one or more registers 314 are positioned in a command path to implement a non-destructive write mode in order to prevent access or writes to data stored in the non-volatile memory arrays 302, 304, and 306 when the non-destructive write mode is active. For example, the memory device 300 may perform a calibration or initialization sequence to adjust the timing requirements with regards to reading and writing data from the memory device 300 upon an activation or power up of the memory device 300. The calibration process involves writing and reading predetermined data sets into the non-volatile memory arrays 302, 304, and 306. As explained above, in some cases, this could cause the data stored in the non-volatile memory arrays 302, 304, and 306 to be inadvertently overwritten.

In the illustrated example, the one or more registers 314 may prevent the activate and precharge commands 310 from reaching the non-volatile memory arrays 302, 304, and 306 when the non-destructive write mode is enabled and may allow the activate and precharge commands 310 to reach the non-volatile memory arrays 302, 304, and 306 when the non-destructive write mode is disabled. The illustrated example also shows routing circuitry 316 configured to route the activate and precharge commands 310 (or access commands) to the corresponding non-volatile memory array 302, 304, and 306. In other examples, the routing circuitry 316 may be removed or incorporated into the control circuitry 312, for instance, when a register 314 is associated with each of the memory arrays 302, 304, and 306, as described above with respect to FIG. 2.

Figure 4:
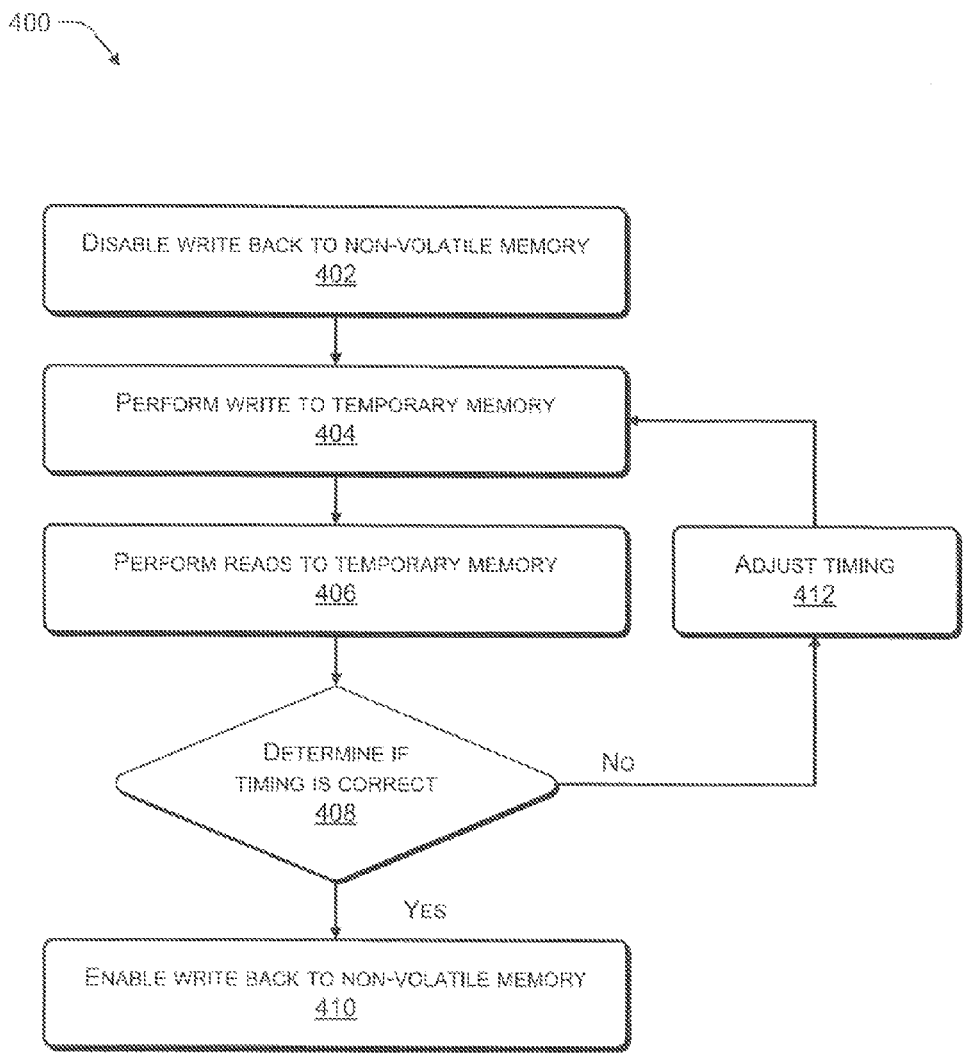
FIG. 4 is a flow diagram showing an illustrative process for performing write based calibration or write based initialization of a memory device and maintaining data stored in one or more non-volatile memory arrays.

FIG. 4 is a flow diagram illustrating an example process implementing non-destructive write mode during initialization or calibration sequence of a memory device. The process is illustrated as a collection of blocks in a logical flow diagram, which represents a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

FIG. 4 is a flow diagram showing an illustrative process 400 for performing write based calibration or write based initialization of a memory device and maintaining data stored in one or more non-volatile memory arrays. In general, a memory device may perform a write based calibration or write based initialization sequence to adjust the timing with regards to reading and writing data from the memory device upon initialization or power up of the memory device. The calibration process typically involves writing and reading predetermined data sets into the memory arrays. Unfortunately, in some cases, memory devices having non-volatile memory arrays may be utilized by an electronic device to store executable code, in addition to or in lieu of the electronic devices disk drives, as the memory devices are capable of maintaining data when the power supply is deactivated and the calibration process may inadvertently cause the excitable code to be overwritten, as may external sources expect the memory arrays to be non-initialized following power off periods.

Thus, in some cases, when the arrays of a memory device store executable code or data intended to persist through the deactivation of the memory device, the executable code or persistent data may be partially or completely overwritten by the calibration data during the initialization sequence, potentially resulting in errors, loss of data, and/or corruption of the code. Therefore, a volatile memory array may be paired with each of the non-volatile memory arrays in the memory device, such that data may be loaded from and written back to the volatile memory arrays during initialization or calibration without overwriting the data stored in the non-volatile array.

In some cases, the memory devices may be configured to include control circuitry that may route activate and precharge commands to the non-volatile memory arrays and that may route read and write commands to the volatile memory arrays, such that data may transferred to and from the non-volatile array to the volatile array and to and from the volatile array to a cache or other external location. In this manner, the calibration or initialization sequence of the memory device may be performed via read and write commands issued to the volatile memory arrays without affecting the data stored in the non-volatile memory arrays.

In some examples, the memory device may also include one or more registers to prevent activate and precharge operations from being performed during initialization or calibration. For instance, the memory device may include one or more user accessible or programmable registers that may allow a user or an external source to set a write mode of operating that prevents access to the data stored in the non-volatile memory arrays. In other examples, the memory device may be configured to default to a non-destructive write mode (for instance, via an initialization register), in response to a power up of the memory device and to exit the non-destructive write mode following a signal from control circuitry indicating that the calibration or initialization sequence is complete. In some examples, the register(s) may include one or more initialization or mode registers, one or more user accessible registers, one or more flip flops, latches, or other storage elements.

At 402, the process 400 includes disabling write back to non-volatile memory. For example, a user or an external source may cause one or more registers to be set indicating to the memory device that the memory device is in a non-destructive write mode and/or a non-destructive read mode. In other examples, the memory device may include one or more initialization registers that default to the non-destructive write mode and/or the non-destructive read mode in response to an activation of the memory device or an associated electronic device. In some particular examples, the register may cause the memory device to enter a non-destructive write mode, allowing reads to be performed with regards to the non-volatile memory arrays.

In general, when the non-destructive write mode and/or the non-destructive read mode are enabled, the memory device prevents access to the non-volatile memory arrays, while allowing read and write access to volatile memory arrays. For example, the memory device may include pairs of non-volatile memory arrays and volatile memory arrays, for instance, to assist in preventing errors from occurring in the non-volatile memory arrays when a write is in progress during a power failure or other interruption of the memory device. Thus, in some implementations, the non-destructive write mode and/or the non-destructive read mode may allow an external source to read and write the predetermined data sets into the volatile or temporary memory arrays during the initialization or calibration sequence in order to calibrate timing requirements with respect to reading and writing data to the memory device without affecting the data stored in the non-volatile memory arrays.

At 404, the process 400 includes performing temporary writes to memory. For example, the memory device may receive commands to write data, and the memory device may allow the writes to the temporary memory arrays (e.g., the volatile memory arrays) and may prevent the writes to the non-volatile memory arrays. For example, during the calibration sequence, the external source may issue write commands to write predetermined data into the memory device. In some examples, while the non-destructive write mode and/or the non-destructive read mode is active (and write back is disabled to the non-volatile memory arrays), the memory device may route the write command to volatile or temporary memory, thus preventing the data in the non-volatile memory arrays from being inadvertently overwritten.

At 406, the process 400 includes performing reads to temporary memory. For example, the memory device may receive commands to read data, and the memory device may allow the reads to the temporary memory arrays, while preventing access to the non-volatile memory arrays. As described above, during the calibration sequence, the external source may issue read commands to read the predetermined data written into the memory device (at 404). In some examples, while the non-destructive write mode and/or the non-destructive read mode is active (and reads are disabled to the non-volatile memory arrays), the memory device may route the read command to volatile or temporary memory, thus preventing the data in the non-volatile memory arrays from being accessed. In other examples, the memory device may disable the data transfer between the volatile or temporary memory arrays and non-volatile memory arrays, such that when the precharge and activate commands are received by the memory device no data is transferred between the temporary or volatile memory arrays and the non-volatile memory arrays.

At 408, the process 400 includes determining whether the timing is correct. For example, the external source and/or the memory device may determine if the timing is correct. To illustrate, when the timing associated with reading data is being calculated, predetermined data may be written into the temporary memory (e.g., at 404) and then the data read from the temporary memory array (e.g., at 406) may be compared with the predetermined data to determine if the timing is correct. For example, with respect to the read timing, if the data that is read from the temporary memory array matches the predetermined data that is written to the temporary memory array, then the timing is correct. If the timing is correct, the process 400 may proceed to 410. However, if the timing is incorrect, the process 400 advances to 412 in order to adjust the read timing. The process 400 then returns to 404. In this manner, the external source may calibrate the timing requirements associated with the memory device by reading and writing data to the temporary memory arrays without inadvertently overwriting the data stored in the non-volatile memory arrays.

At 410, the process 400 includes enabling write back to non-volatile memory. For example, the memory device and/or the external source may re-enable the write back to the non-volitale memory arrays. To illustrate, the external source may enable the write back in response to determining that the write and the read timing is correct. In other examples, the write back may be enabled and/or the non-destructive write mode and/or the non-destructive read mode may be disabled upon a completion of the calibration sequence and/or the initialization sequence of the memory device. In some specific examples, the writes may be enabled and/or the non-destructive write mode and/or the non-destructive read mode may be disabled in response to the completion of a power up or initialization sequence of an electronic device associated with the memory device.

Figure 5:
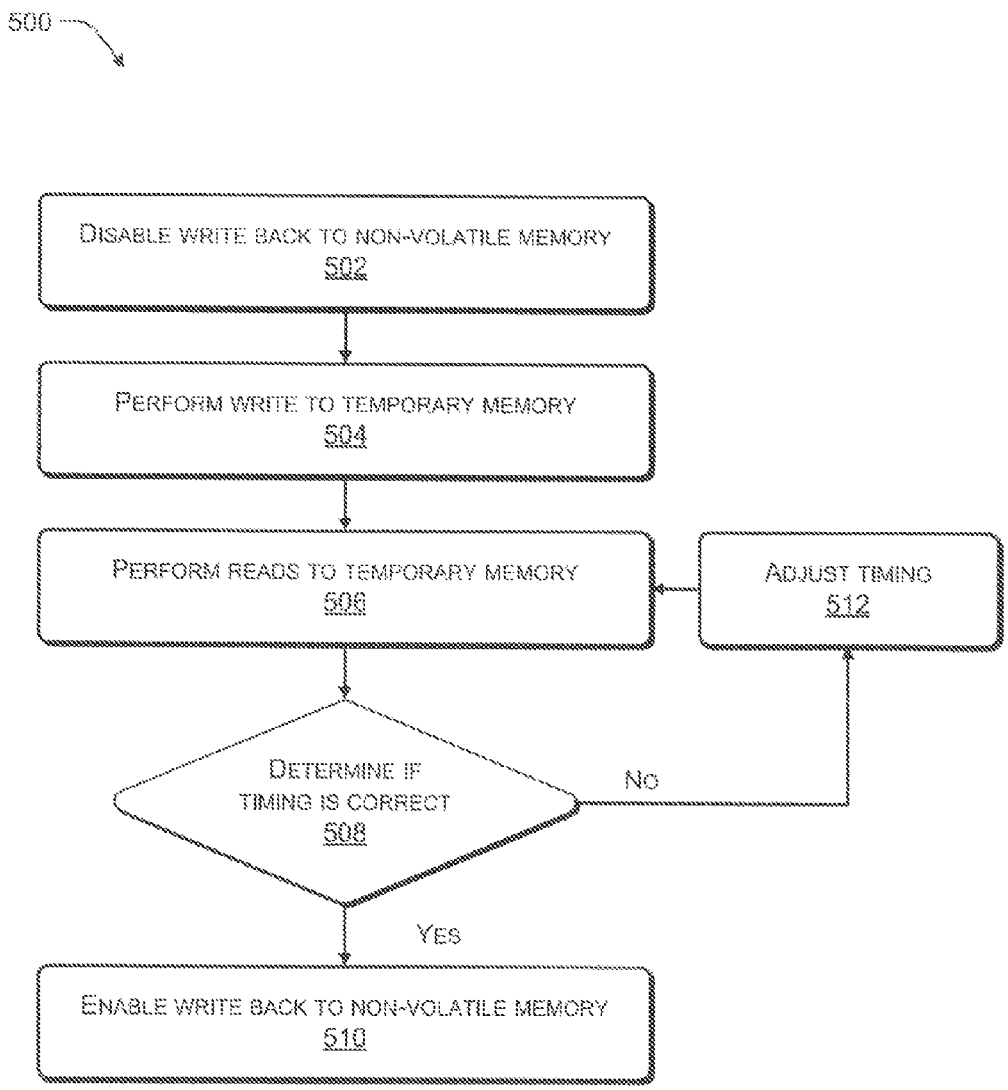
FIG. 5 is a flow diagram showing an illustrative process for performing read based calibration or read based initialization of a memory device and maintaining data stored in one or more non-volatile memory arrays.

FIG. 5 is a flow diagram showing an illustrative process for performing read based calibration or read based initialization of a memory device and maintaining data stored in one or more non-volatile memory arrays. In general, a memory device may perform a read based calibration or read based initialization sequence to adjust the timing with regards to reading and/or writing data from the memory device upon initialization or power up of the memory device. The calibration process typically involves writing and reading predetermined data sets into the memory arrays. Unfortunately, in some cases, memory devices having non-volatile memory arrays may be utilized by an electronic device to store executable code, in addition to or in lieu of the electronic devices disk drives, as the memory devices are capable of maintaining data when the power supply is deactivated and the calibration process may inadvertently cause the excitable code to be overwritten, as may external sources expect the memory arrays to be non-initialized following power off periods.

Thus, in some cases, when the arrays of a memory device store executable code or data intended to persist through the deactivation of the memory device, the executable code or persistent data may be partially or completely overwritten by the calibration data during the initialization sequence, potentially resulting in errors, loss of data, and/or corruption of the code. Therefore, a volatile memory array may be paired with each of the non-volatile memory arrays in the memory device, such that data may be loaded from and written back to the volatile memory arrays during initialization or calibration without overwriting the data stored in the non-volatile array.

In some cases, the memory devices may be configured to include control circuitry that may route activate and precharge commands to the non-volatile memory arrays and that may route read and write commands to the volatile memory arrays, such that data may be transferred to and from the non-volatile array to the volatile array and to and from the volatile array to a cache or other external location. In this manner, the calibration or initialization sequence of the memory device may be performed via read and write commands issued to the volatile memory arrays without affecting the data stored in the non-volatile memory arrays.

In some examples, the memory device may also include one or more registers to prevent activate and precharge operations from being performed during initialization or calibration. For instance, the memory device may include one or more user accessible or programmable registers that may allow a user or an external source to set a write mode of operating that prevents access to the data stored in the non-volatile memory arrays. In other examples, the memory device may be configured to default to a non-destructive write mode (for instance, via an initialization register), in response to a power up of the memory device and to exit the non-destructive write mode following a signal from control circuitry indicating that the calibration or initialization sequence is complete. In some examples, the register(s) may include one or more initialization or mode registers, one or more user accessible registers, one or more flip flops, latches, or other storage elements.

At 502, the process 500 includes disabling write back to non-volatile memory. For example, a user or an external source may cause one or more registers to be set indicating to the memory device that the memory device is in a non-destructive write mode and/or a non-destructive read mode. In other examples, the memory device may include one or more initialization registers that default to the non-destructive write mode and/or the non-destructive read mode in response to an activation of the memory device or an associated electronic device. In some particular examples, the register may cause the memory device to enter a non-destructive write mode, allowing reads to be performed with regards to the non-volatile memory arrays.

In general, when the non-destructive write mode and/or the non-destructive read mode are enabled, the memory device prevents access to the non-volatile memory arrays, while allowing read and write access to volatile memory arrays. For example, the memory device may include pairs of non-volatile memory arrays and volatile memory arrays, for instance, to assist in preventing errors from occurring in the non-volatile memory arrays when a write is in progress during a power failure or other interruption of the memory device. Thus, in some implementations, the non-destructive write mode and/or the non-destructive read mode may allow an external source to read and write the predetermined data sets into the volatile or temporary memory arrays during the initialization or calibration sequence in order to calibrate timing requirements with respect to reading and writing data to the memory device without affecting the data stored in the non-volatile memory arrays.

At 504, the process 500 includes performing temporary writes to memory. For example, the memory device may receive commands to write data, and the memory device may allow the writes to the temporary memory arrays (e.g., the volatile memory arrays) and may prevent the writes to the non-volatile memory arrays. For example, during the calibration sequence, the external source may issue write commands to write predetermined data into the memory device. In some examples, while the non-destructive write mode and/or the non-destructive read mode is active (and write back is disabled to the non-volatile memory arrays), the memory device may route the write command to volatile or temporary memory, thus preventing the data in the non-volatile memory arrays from being inadvertently overwritten.

At 506, the process 500 includes performing reads to temporary memory. For example, the memory device may receive commands to read data, and the memory device may allow the reads to the temporary memory arrays, while preventing access to the non-volatile memory arrays. As described above, during the calibration sequence, the external source may issue read commands to read the predetermined data written into the memory device (at 504). In some examples, while the non-destructive write mode and/or the non-destructive read mode is active (and reads are disabled to the non-volatile memory arrays), the memory device may route the read command to volatile or temporary memory, thus preventing the data in the non-volatile memory arrays from being accessed. In other examples, the memory device may disable the data transfer between the volatile or temporary memory arrays and non-volatile memory arrays, such that when the precharge and activate commands are received by the memory device no data is transferred between the temporary or volatile memory arrays and the non-volatile memory arrays.

At 508, the process 500 includes determining whether the timing is correct. For example, the external source and/or the memory device may determine if the timing is correct. To illustrate, when the timing associated with reading data is being calculated, predetermined data may be written into the temporary memory (e.g., at 504) and then the data read from the temporary memory array (e.g., at 506) may be compared with the predetermined data to determine if the timing is correct. For example, with respect to the read timing, if the data that is read from the temporary memory array matches the predetermined data that is written to the temporary memory array, then the timing is correct. If the timing is correct, the process 500 may proceed to 510. However, if the timing is incorrect, the process 500 advances to 512 in order to adjust the read timing. The process 500 then returns to 506. In this manner, the external source may calibrate the timing requirements associated with the memory device by repeatedly adjusting timing at 512 and re-reading data at 506 to the temporary memory arrays without inadvertently overwriting the data stored in the non-volatile memory arrays.

At 510, the process 500 includes enabling write back to non-volatile memory. For example, the memory device and/or the external source may re-enable the write back to the non-volitale memory arrays. To illustrate, the external source may enable the write back in response to determining that the write and the read timing is correct. In other examples, the write back may be enabled and/or the non-destructive write mode and/or the non-destructive read mode may be disabled upon a completion of the calibration sequence and/or the initialization sequence of the memory device. In some specific examples, the writes may be enabled and/or the non-destructive write mode and/or the non-destructive read mode may be disabled in response to the completion of a power up or initialization sequence of an electronic device associated with the memory device.

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A memory, comprising:
   an array of non-volatile memory cells;
   a register that stores a value, wherein the value determines that the memory is in one of a normal operation mode and a non-destructive operation mode;
   control circuitry coupled to the array of non-volatile memory cells and the register, wherein the control circuitry is configured to prevent operations associated with an activate command received by the memory when the memory is in the non-destructive operation mode.

2. The memory of claim 1 further comprising:
an array of volatile memory cells coupled to the control circuitry and the array of non-volatile memory cells, wherein when the value in the register determines that the memory is in the normal operation mode, the memory responds to an activate command received by the memory by loading data stored in the array of non-volatile memory cells into the array of volatile memory cells.

3. The memory of claim 1 further comprising:
storage elements not in the array of non-volatile memory cells, wherein when the value in the register determines that the memory is in the non-destructive operation mode, memory operations access the storage elements not in the array.

4. The memory of claim 1 further comprising:
a temporary memory array, wherein when the value in the register determines that the memory is in the non-destructive operation mode, memory operations access the temporary memory array.

5. The memory of claim 1, wherein the control circuitry is configured to block writes to the array of non-volatile memory cells when the value in the register determines that the memory is in the non-destructive operation mode.

6. The memory of claim 1, wherein the register is a mode register.

7. The memory of claim 1, wherein the memory is configured to store the value in the register in response to a command received from a memory controller.

8. The memory of claim 1, wherein the register defaults to a value corresponding to the non-destructive operation mode.

9. The memory of claim 8, wherein the register defaults to the value corresponding to the non-destructive operation mode on power up or reset.

10. The memory of claim 8, wherein the memory exits the non-destructive operation mode automatically on completion of a calibration procedure.

11. The memory of claim 1, wherein the register includes a flip flop, a latch, or a storage element.

12. The memory of claim 1, wherein the register is a non-volatile register.

13. The memory of claim 1, wherein the array of non-volatile memory cells includes magnetic random access memory (MRAM) cells.

14. A memory, comprising:
an array of non-volatile memory cells; and
control circuitry coupled to the array of non-volatile memory cells, wherein the control circuitry is configured to prevent write operations to the array of non-volatile memory cells when the memory is in the non-destructive operation mode such that there is no overwriting of data stored in the array of non-volatile memory cells.

15. The memory of claim 14, wherein the memory is placed in the non-destructive operation mode based on an input signal received by the memory.

16. The memory of claim 15, wherein the input signal is applied to a pin on the memory.

17. The memory of claim 14, wherein the control circuitry is configured to ignore activate commands received by the memory when the memory is in the non-destructive operation mode.

18. The memory of claim 14, wherein the control circuitry is configured to prevent operations associated with an activate command received by the memory when the memory is in the non-destructive operation mode.

19. The memory of claim 14, the control circuitry is configured to access storage elements not in the array of non-volatile memory cells when the memory is in the non-destructive operation mode.

20. A system, comprising:
a memory that includes:
an array of memory cells;
a temporary memory array;
a programmable register that stores a value, wherein the value determines that the memory is in one of a normal operation mode and a non-destructive operation mode;
control circuitry coupled to the array of memory cells, the temporary memory array, and the register, wherein the control circuitry is configured to:
block writes to the array of memory cells when the value stored in the register indicates that the memory device is in the non-destructive mode of operation; and
allow writes to the temporary memory array when the value stored in the register indicates that the memory device is in the non-destructive mode of operation; and
a memory controller coupled to the memory, wherein the memory includes a write leveling mode in which timing adjustment corresponding to a data strobe signal and a clock occurs, wherein the memory is configured to output leveling feedback to the memory controller during the write leveling mode.

* * * * *